United States Patent
Nodake

(10) Patent No.: US 10,907,607 B2
(45) Date of Patent: Feb. 2, 2021

(54) CIRCUIT AND METHOD FOR CONTROLLING A COIL CURRENT DURING A SOFT SHUT DOWN

(71) Applicant: SEMICONDUCTOR COMPONENTS INDUSTRIES, LLC, Phoenix, AZ (US)

(72) Inventor: Yasuhiro Nodake, Oizumi-Machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/513,984

(22) Filed: Jul. 17, 2019

(65) Prior Publication Data

US 2020/0340441 A1 Oct. 29, 2020

Related U.S. Application Data

(60) Provisional application No. 62/837,899, filed on Apr. 24, 2019.

(51) Int. Cl.
| | |
|---|---|
| F02P 1/00 | (2006.01) |
| F02P 11/06 | (2006.01) |
| H03K 17/082 | (2006.01) |
| F02D 41/22 | (2006.01) |
| F02P 3/055 | (2006.01) |
| F02P 3/045 | (2006.01) |

(52) U.S. Cl.
CPC .............. *F02P 11/06* (2013.01); *F02D 41/22* (2013.01); *F02P 3/0453* (2013.01); *F02P 3/0552* (2013.01); *H03K 17/0828* (2013.01)

(58) Field of Classification Search
CPC .. F02B 1/04; F02P 1/083; F02P 3/0884; F02P 9/002
USPC .......................... 123/594, 605, 644, 650, 651
See application file for complete search history.

(56) References Cited

U.S. PATENT DOCUMENTS

| | | | | |
|---|---|---|---|---|
| 4,361,785 | A * | 11/1982 | Stapleton | G09G 1/04 |
| | | | | 315/382 |
| 5,627,421 | A * | 5/1997 | Miller | F16C 32/0457 |
| | | | | 310/51 |
| 10,514,016 | B1 * | 12/2019 | Nodake | H03K 17/166 |
| 2004/0120090 | A1 | 6/2004 | Galli et al. | |
| 2016/0134085 | A1 | 5/2016 | Obe et al. | |
| 2016/0222939 | A1 | 8/2016 | Tang et al. | |
| 2019/0190238 | A1 * | 6/2019 | Yamamoto | F02P 3/055 |

* cited by examiner

*Primary Examiner* — John Kwon
(74) *Attorney, Agent, or Firm* — Brake Hughes Bellermann LLP

(57) ABSTRACT

A current control circuit for an ignition system (i.e., igniter current limiter) is disclosed. The current control circuit can reduce a coil current over a soft shut down (SSD) period using an insulated gate bipolar transistor (IGBT) that is controlled by a negative feedback loop, which controls the current limit of the IGBT according to a SSD profile. In order to prevent an unwanted current rise during the soft shut down period, the current control circuit compares a gate voltage of the IGBT to a reference signal and based on the comparison can enable the SSD profile to include a fast ramp. The fast ramp quickly lowers the current limit of the IGBT so that the coil current equals the current limit and can be controlled by the negative feedback loop.

8 Claims, 9 Drawing Sheets

CIRCUIT AND METHOD FOR CONTROLLING A COIL CURRENT DURING A SOFT SHUT DOWN

CROSS-REFERENCE TO RELATED APPLICATIONS

This application claims the benefit of U.S. Provisional Patent Application No. 62/837,899, filed on Apr. 24, 2019, the entire contents of which is incorporated herein by reference.

FIELD OF THE DISCLOSURE

The present disclosure relates to ignition systems and more specifically to a circuit and method for slowly discharging a coil during to prevent a spark.

BACKGROUND

A coil in an ignition system can be charged to a current limit by an applied voltage. A transistor in series with the coil may be controlled to abruptly switch OFF the coil current, and in response, a large coil voltage is created as the coil attempts to maintain the otherwise decreasing magnetic flux. The large voltage can be transformed to an even higher voltage across a secondary coil that in series with a spark gap. When the secondary coil voltage exceeds the breakdown resistance of the spark gap, a spark is created.

In certain situations, it is necessary to discharge the coil without producing a spark. For example, an engine control unit (ECU) coupled to an ignition system may detect that a potentially harmful situation with a coil that has been charged to a coil current. In response, a coil current control (CCC) circuit can be triggered to perform a soft shut down of the coil (i.e., to de-energize the coil without a spark).

To perform a soft shut down, a CCC circuit is configured to sense a coil current, compare the coil current to a reference level to obtain a difference, and control a transistor in series with the coil to reduce the difference. This process can be repeated as the reference level is reduced in order to reduce the coil current according to a soft shut down profile. Performing a soft shut down before a coil current is charged to a current limit of the transistor, however, can result in a period during a soft shut down in which the coil current is uncontrolled.

SUMMARY

Accordingly, in one general aspect, the present disclosure generally describes a coil current control circuit. The coil current control circuit includes a transistor (e.g., an insulated gate bipolar transistor) that in series with a coil. The transistor is controllable to conduct current at or below a coil current limit. The coil current control circuit also includes a current sensing circuit that is configured to sense a coil current flowing through the transistor. The coil current control circuit also includes a current limit control circuit that is configured to compare a voltage from the current sensing circuit to a SSD signal from a ramp generator circuit. Then, based on the comparison, the current limit control circuit is configured to reduce the coil current over a SSD period according to a profile of the SSD signal, which is based on a gate voltage of the transistor.

In another aspect, the disclosure generally describes an ignition system. The ignition system includes an engine control unit (ECU) that is configured to monitor the ignition system and an ignition coil. The ignition system further includes an insulated gate bipolar transistor (IGBT) that is coupled to the ignition coil and configured to conduct a coil current of the ignition coil that is at or below a current limit. The ignition system also includes a soft shut down (SSD) circuit that is coupled to the ECU and coupled in a feedback loop with the IGBT. Upon receiving a signal from the ECU, the SSD circuit is configured to control the IGBT to reduce the current limit according to a fast ramp profile with the coil current is below the current limit and according to a slow ramp profile when the coil current is at the current limit.

In another aspect, the disclosure generally describes a method for discharging a coil. The method includes charging the coil to a coil current and receiving a soft shut down activation signal that indicates that a soft shut down of the coil is required. The method further includes determining that the coil current is below a current limit of a transistor coupled to the coil and reducing the current limit of the transistor according to a fast ramp profile. The method also includes determining that the coil current is at the current limit of the transistor and reducing the current limit of the transistor according to a slow ramp profile until the coil is discharged.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

Generally, a coil current control (CCC) circuit for an ignition system includes a transistor in series with a coil to control the current through the coil (i.e., the coil current). For example, the CCC circuit may be configured to charge a coil or discharge a coil. The CCC can be configured discharge a coil quickly to produce a spark (i.e., a hard shut down(HSD)) or the CCC circuit can be configured to steadily decrease a coil current to discharge the coil without creating a spark (i.e., a soft shut down (SSD))

A SSD may be required to terminate an ignition process in certain circumstances. For example, a high temperature may damage circuitry (e.g., the transistor) in an ignition system. Accordingly, the CCC circuit may be triggered to perform a SSD when a temperature exceeding a thermal shutdown threshold is detected. The CCC circuit may perform the SSD by gradually reducing a current limit of a transistor; however, a coil current flowing through the transistor that is below the current limit of the transistor will not be affected by changes in the current limit. In other words, a coil current may be uncontrolled until the current limit of the transistor is reduced to a point at which it equals the coil current. During this uncontrolled period of a SSD, the coil current may actually rise instead of being lowered. An unwanted (e.g., undesirable) current rise is especially undesirable during a SSD triggered by a thermal shut down (TSD) condition because additional heat, caused by an uncontrolled current rise, could be damaging. The present disclosure describes a circuit and method to reduce an unwanted current rise during a SSD.

Figure 1:
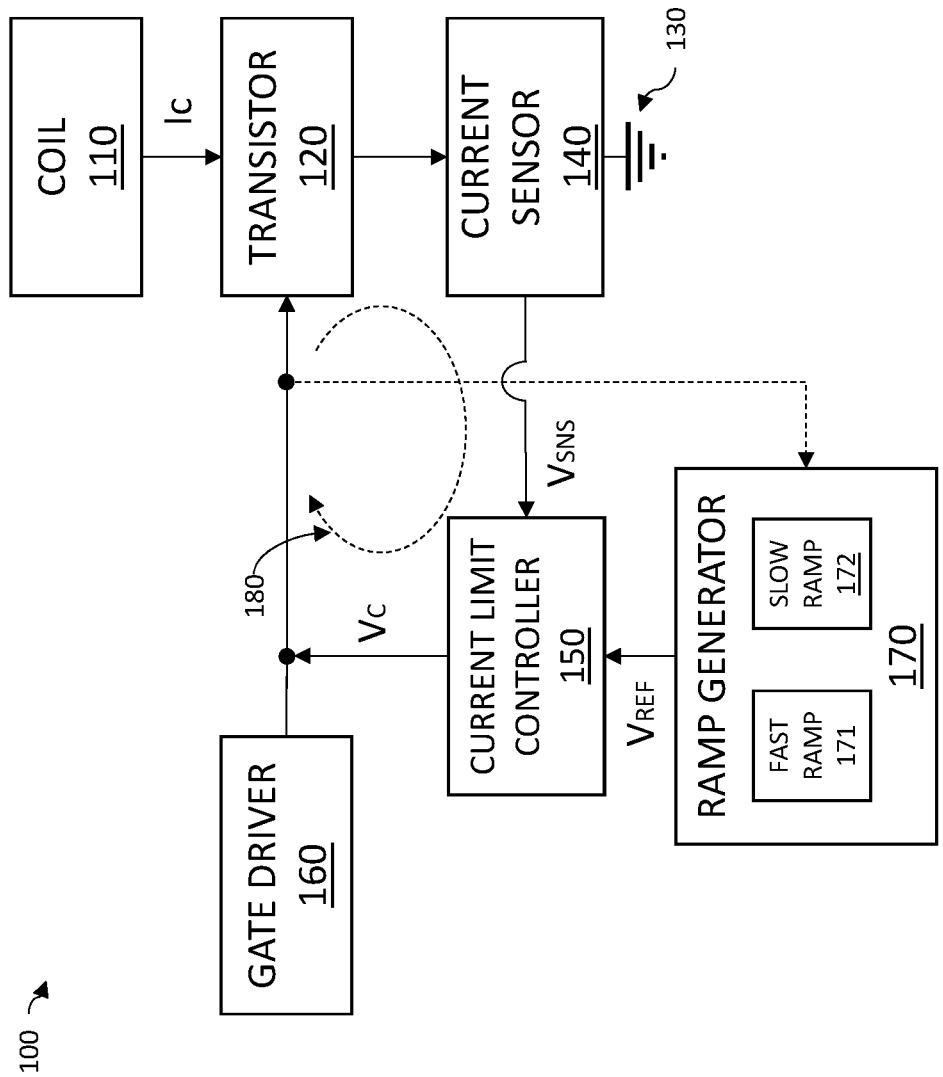
FIG. 1 is a block diagram of a coil current control circuit according to an implementation of the present disclosure.

An implementation of a coil current control circuit is show in FIG. 1. In the CCC circuit 100, a coil 110 is coupled to a transistor 120 that can be configured to limit the flow of current through the coil to a ground 130. More specifically, the transistor 120 may be controlled to conduct a current that is at or below a current limit determined by an operating point of the transistor. A current sensing circuit (i.e., current sensor) 140 is included in the CCC circuit to measure the current flowing through the coil 110 and the transistor 120. The CCC circuit 100 also includes a current limit control circuit (i.e., current limit controller) 150 that, along with a gate driver circuit (i.e., gate driver) 160 can control the operating point of the transistor 120. For example, the operating point of the transistor 120 may be controlled so that the transistor is ON (i.e., conducting) or OFF (i.e., not conducting). When the transistor is ON, the operating point of the transistor may be further controlled to adjust a current limit. The current limit controller 150 is configured to compare a voltage ($V_{SNS}$) from the current sensor 140 to a reference voltage ($V_{REF}$) from a ramp generator 170. Based on the difference between $V_{SNS}$ and $V_{REF}$, a control voltage ($V_C$) is produced to adjust the operating point transistor. The gate driver 160 amplifies the control voltage to a power that is sufficient to (quickly) adjust the transistor. When the coil current is at the current limit of the transistor 120, a negative feedback loop 180 is formed so that the coil current ($I_C$) changes according to (i.e., follows) the reference voltage ($V_{REF}$). As a result, the reference voltage ($V_{REF}$) can have a profile that, over time, ramps from a higher voltage to a lower voltage (e.g., zero volts) in order to gradually reduce the current of the coil ($I_C$) over a soft shut down period.

Figure 2:
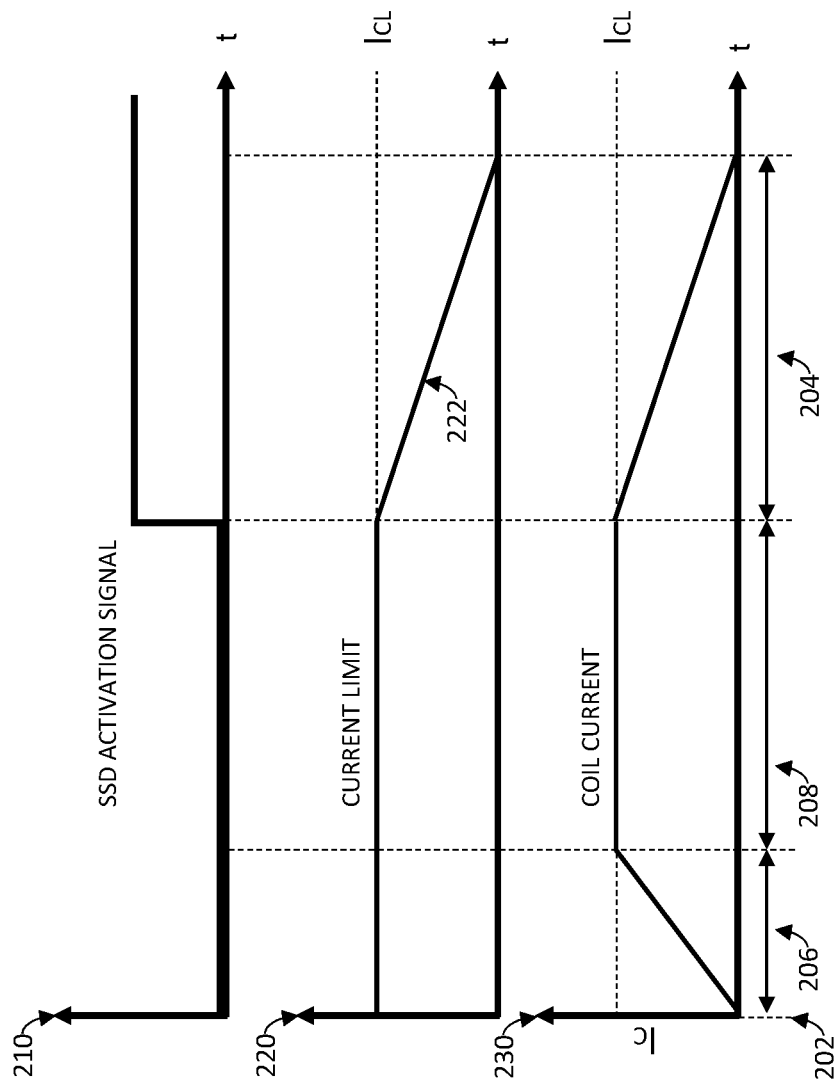
FIG. 2 are signal graphs illustrating a soft shut down of a coil current after a coil current has reached a current limit.

FIG. 2 illustrates three possible signals associated with the CCC circuit 100 of FIG. 1. Each signal is plotted versus time and all signals are scaled an aligned with one another. A first signal graph 210 of FIG. 2 illustrates is a soft-shutdown (SSD) activation signal. The SSD activation signal can be a digital signal that triggers (i.e., activates) the CCC circuit 100 to perform a SSD. For example, the SSD activation signal may be a logical low (voltage) level during a normal operation and a logical high (voltage) level during a soft shut down. The transition from the logical low to the logical high may designate the beginning of a soft shut down period 204.

A second signal graph 220 of FIG. 2 illustrates a possible current limit of the transistor 120. When not otherwise controlled by the CCC circuit 100 (i.e., outside the SSD period) the transistor can be configured (e.g., turned fully ON) to conduct any current at or below a maximum current limit ($I_{CL}$). During the SSD period 204, the operating point of the transistor can be controlled (e.g., gradually turned OFF) to gradually reduce the current limit. For example, the current limit may be reducing according to a slow ramp profile 222.

A third signal graph 230 of FIG. 2 illustrates a possible coil current ($I_c$). As shown, the coil current (IC) defines three periods. A first period is a charging period 206 during which the coil inductance charges. The transistor 120 may be turned ON at a start 202 of the charging period to allow the coil current to rise according to the inductance of the coil. During the charging period 206, the current in the coil increases until it reaches a current limit determined by the transistor 120. The charging profile is typically a linear rise (i.e., ramp up) from a zero current to a maximum current limit ($I_{CL}$). The charging profile is generally based on a response of an inductance of the coil 110 to an applied voltage, wherein a sudden current change is opposed by an electromotive force induced by a changing magnetic field. Variations in a charging profile can exist if, for example, the applied voltage is varied during a charging period 206.

The charged coil conducts current at the maximum current limit ($I_{CL}$) for a dwell period 208. After the coil has charged, the transistor can be controlled to quickly shut OFF, allowing no current to flow. In other words a HSD may be performed. The HSD can result in a spark created at a spark gap inductively coupled to the coil 110. In some cases, the charged coil conducts current at the maximum current limit ($I_{CL}$) for a dwell period 208 that is longer than a predetermined over-dwell period (ODP). When this occurs a SSD can be triggered (e.g., by the SSD activation signal) to prevent damage (e.g., overheating) to the coil, the transistor, or other circuitry in an ignition system. In other cases, the current at the maximum current limit ($I_{CL}$) can heat the transistor 120 to a temperature above a thermal shut down (TSD) temperature. As for the ODP condition, when a TSD temperature occurs, a SSD can be triggered (e.g., by the SSD activation signal) to prevent damage to the transistor. SSD in response to a TSD condition may be desirable for implementations in which the transistor is an insulated gate bipolar transistor (IGBT) because IGBT protection can be highly desirable for system reliability.

The coil current is gradually lowered (i.e., the coil is gradually discharged) during a SSD period 204 triggered by the SSD activation signal. During the SSD period 204, the CCC circuit, using its negative feedback loop, gradually lowers the current limit of the transistor to gradually lower the coil current. The SSD profile can be a linear decrease (i.e., ramp down) from a maximum current limit ($I_{CL}$) to zero. The SSD profile of the coil current corresponds to the profile of the reference voltage ($V_{REF}$) output by the ramp generator. The ramp generator may produce a profile that is reduced slowly over time (e.g., a ramp) to prevent a spark from being produced at a spark gap. During the SSD period 204, the coil current profile matches the slow ramp profile 222 of the current limit because the current in the coil 110 is limited by the current limit of the transistor 120. A difference can exist, however, if the current in the coil 110 is not limited by the current limit of the transistor.

Figure 3:
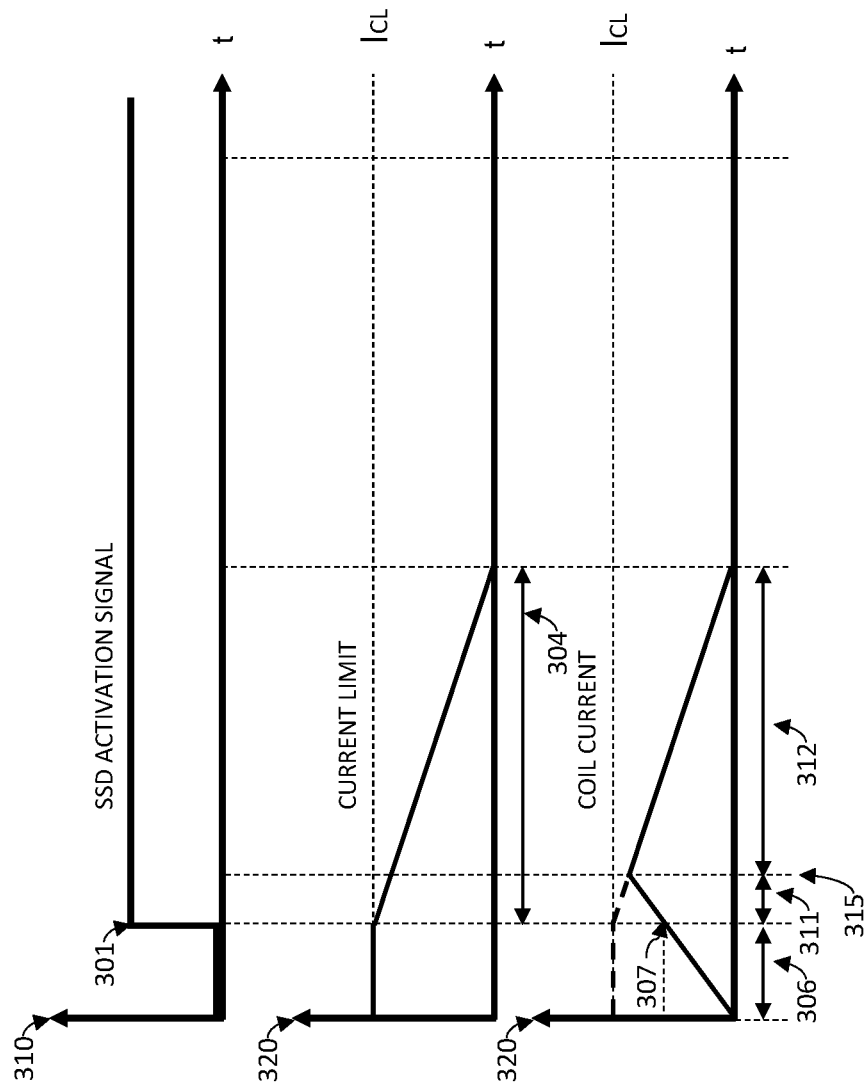
FIG. 3 are signal graphs illustrating a soft shut down of a coil current before a coil current has reached a current limit.

FIG. 3 illustrates three possible signals associated with the CCC circuit 100 of FIG. 1 for the scenario in which a SSD is triggered before a coil is charged to a current limit of the transistor. In the SSD scenario shown, a SSD activation signal, shown in a first signal graph 310, is toggled to trigger a soft shut down at a time 301, and the current limit, shown in a second signal graph 320, is shut down according to a slow ramp profile. The coil current, shown in the third signal graph 330, does not match the profile of the current limit shown in the second signal graph 320. Instead, the coil current is rises over a charging period 306 to a current level 307 that is below the maximum current limit ($I_{CL}$) of the transistor. Despite the activation of a SSD, the control of the coil current does not begin until the coil current is limited by the current limit of the transistor. Accordingly, the coil current continues to rise until an intercept time 315 at which the increasing coil current intercepts the decreasing current limit. In other words, if a soft shut down is activated before the coil current has reached the current limit set by the transistor, a SSD period 304 may include an uncontrolled portion (i.e., uncontrolled period) 311 and a controlled portion (i.e., controlled period) 312. The coil current can follow the SSD profile of the current limit during the controlled period 312 but may continue to rise during the uncontrolled period 311.

An uncontrolled rise in coil current during an uncontrolled period (i.e., portion) 311 of a soft shut down period may have unwanted effects. For example, if an SSD activation signal is created in response to the thermal shut down (TSD) event, then a coil current rise after the TSD event may cause damage. Minimizing the uncontrolled period 311 (e.g., in time, as a percentage of the SSD period, or both) can minimize a rise in the coil current.

Minimizing the uncontrolled period 311 may be accomplished by adjusting a ramp profile of the current limit. For example, increasing the rate (i.e., slope) at which the current limit ramps down can decrease the uncontrolled period. Simply, increasing the rate at which the current limit ramps down for the (entire) SSD period 304, however, may risk an unwanted spark and is unnecessary after the coil current is controlled by (i.e., equals) the current limit of the transistor. Instead, the disclosed coil current control can control the current limit of the transistor with current limit profile that can include a fast ramp profile during a period when the coil current is not equal to the current limit of the transistor.

Figure 4:
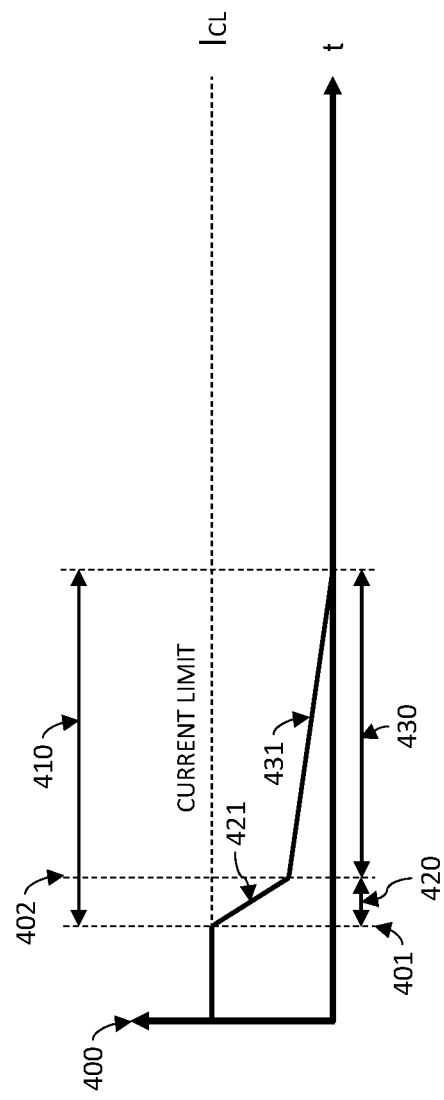
FIG. 4 is a graph of a profile of a current limit for a soft shut down of a coil according to an implementation of the present disclosure

FIG. 4 illustrates a signal graph 400 of current limit during a SSD period 410 that begins at a time 401. The soft shut down (SSD) period 410 includes an uncontrolled period 420 and a controlled period 430. The current limit is ramped down from a maximum current limit ($I_{CL}$) to zero current using a fast ramp profile (i.e., fast ramp) 421 during the uncontrolled period 420 and then ramped down using a slow ramp profile (i.e., slow ramp) 431 during the controlled period 430. The fast ramp shifts to a slow ramp at a transition time 402 when the coil current equals a current limit of the transistor.

The disclosed coil current control is configured to determine when a coil current is not equal (e.g., is less than) a current limit of the transistor (i.e., is not limited by the transistor) and to determine when coil current is equals a current limit of the transistor (i.e., is limited by the transistor). Based on the determination, the disclosed CCC circuit is configured to reduce the current limit of the transistor according to a fast ramp profile (i.e., fast ramp) and a slow ramp profile (i.e., slow ramp) during a soft shut down period. In this way, the disclosed coil current control is can minimize an uncontrolled portion of a soft shut down period, during which a coil current may rise. Additionally, the determination allows the disclosed coil current control to operate using only a slow ramp profile when the coil current is equal to the current limit of the transistor at the beginning of a soft shut down period.

Returning to FIG. 1, the coil current control circuit (i.e., ccc circuit 100) includes a ramp generator 170 that is configured to generate and to output a reference voltage ($V_{REF}$) according to a fast ramp profile (i.e., fast ramp 171) or a slow ramp profile (i.e., slow ramp 172) depending on the current of a coil ($I_C$) in relation to a current limit of a transistor 120. In particular, the CCC circuit 100 includes circuitry to determine if the coil current (IC) is at a current limit of the transistor or not at (e.g., below) a current limit of the transistor. The determination can be based on a voltage appearing at a controlling terminal (e.g., a gate terminal) of the transistor 120.

Figure 5:
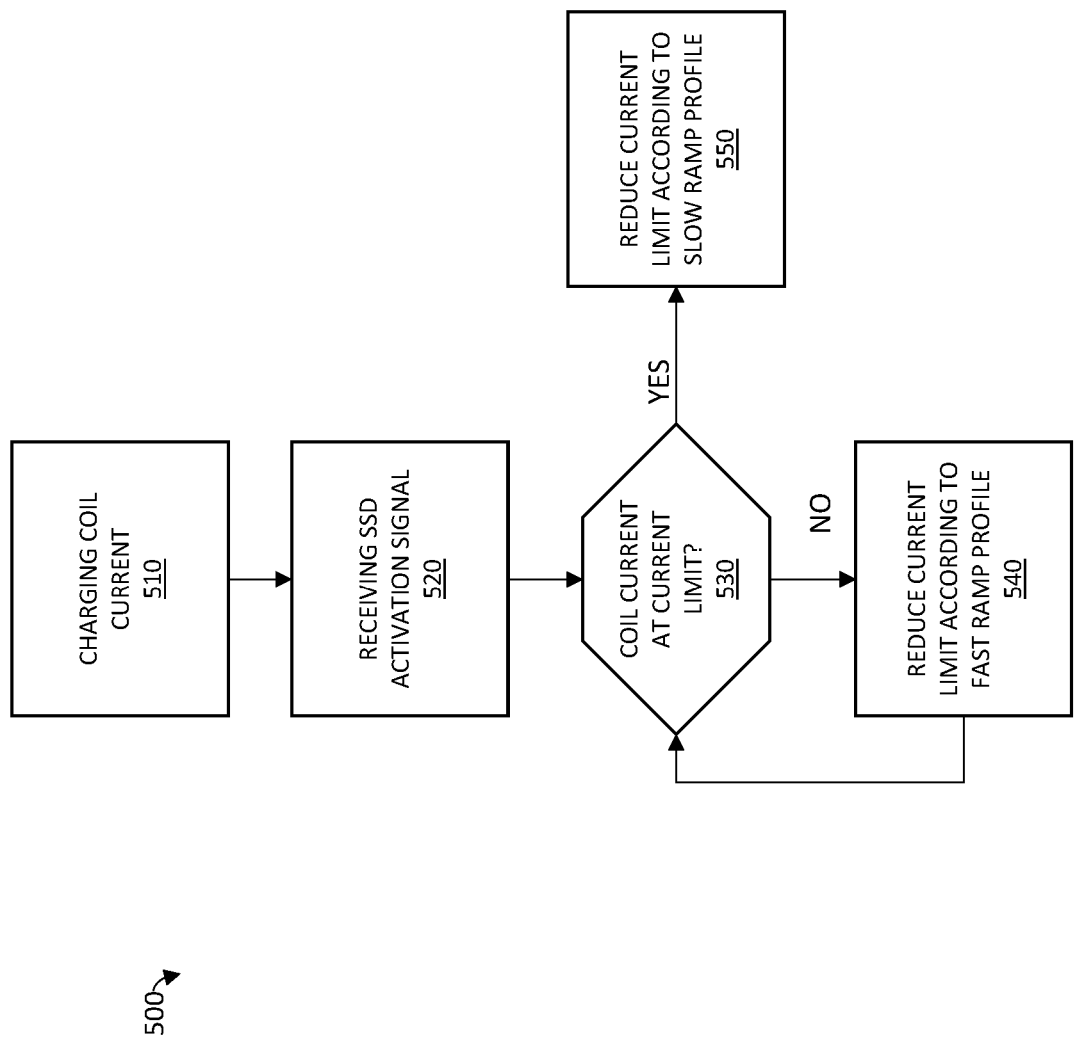
FIG. 5 is a method for discharging a coil according got an implementation of the present disclosure.

FIG. 5 illustrates a method for discharging a coil according to an implementation of the present disclosure. In the method, a coil is charged 510. For example, the transistor in the CCC circuit of FIG. 1 may be controlled to conduct current (i.e., turned fully ON) and a voltage may be applied to the coil. In this configuration, the coil in the current rises as the coil is charged. Next, a SSD activation signal is received that indicates that a SSD of the coil is required. For example, the SSD activation signal may be received by the ramp generator 170 in the CCC circuit of FIG. 1 to trigger the ramp generator 170 to reduce a reference voltage ($V_{REF}$). Additionally, the ramp generator 170 may receive a signal (e.g., voltage) from a controlling terminal (e.g., gate) of the transistor 120 to determine 530 if the coil current is at the current limit of the transistor 120. If the coil current is not equal to the current limit of the transistor (e.g., the coil current is less than the current limit of the transistor), then the current limit of the transistor is reduced 540 according to a fast ramp profile to discharge the coil. The reduction of the current limit according to the fast ramp profile proceeds until the current limit controls the coil current (i.e., until the coil current equals the current limit). When the coil current is at the current limit of the transistor, then the current limit is reduced 550 according to a slow ramp profile to further discharge the coil. It should be not that if, after receiving the SSD activation signal, the coil current is at the current limit then the current limit is reduced according to a slow ramp profile and the fast ramp profile is not used at all to discharge the coil.

Figure 6:
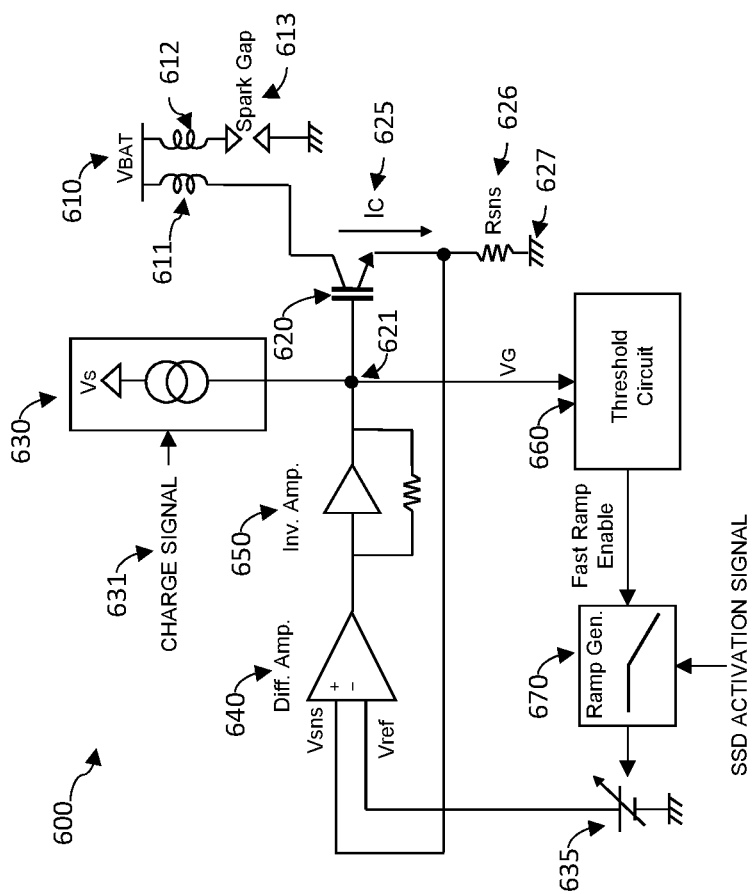
FIG. 6 is a schematic of a coil current control circuit with ramp control according to an implementation of the present disclosure.

FIG. 6 is a schematic of a CCC circuit with ramp control according to an implementation of the present disclosure. The CCC circuit 600 includes and ignition coil having a primary coil 611 and a secondary coil 612. The secondary coil 612 is inductively coupled to the primary coil 611 and is in series with a spark gap 613. The primary coil (i.e., coil) 611 is coupled in series with a transistor 620 which can be controlled to an ON state to allow a voltage $V_{BAT}$ 610 (e.g., 12 volts) to cause a coil current ($I_C$) 625 to flow from the coil 611 to a ground 627 through a sense resistor ($R_{SNS}$) 626.

In some implementations, the transistor 620 is an insulated gate bipolar transistor (IGBT). The collector of the IGBT is coupled to the coil 611, the emitter of the IGBT is coupled to the sense resistor 626, and the gate (i.e., the controlling terminal) is coupled to a gate driver that acts as a power amplifier to provide the gate of the IGBT sufficient powered signals for operation. The gate driver 630 may be enabled to enable operation of the entire circuit. For example, a charge signal 631 (e.g., from an ECU) may enable the gate driver 630. In this case, a logical transition of the charge signal 631 may signify the beginning of a coil current rise.

In a hard shut down, the transistor can be controlled to an OFF state (i.e., turned OFF) quickly so that a voltage sufficient to produce a spark at the spark gap is generated by an induced voltage across the coil 611. In a soft shut down, the transistor 620 can be controlled to an OFF state (i.e., turned OFF) gradually to lower the coil current slow so that the voltage produced at the spark gap is insufficient to break down the spark gap 613.

A voltage ($V_{SNS}$) produce across the sense resistor ($R_{SNS}$) 626 corresponds to the coil current. The voltage $V_{SNS}$ may be coupled to a first input (e.g., a positive input) of a differential amplifier 640. Additionally, a reference voltage $V_{REF}$ from variable voltage source 635 may be applied to a second input (e.g., negative input) of the differential amplifier 640. The differential amplifier 640 produces a control voltage (i.e., error signal) that represents the difference between $V_{SNS}$ and $V_{REF}$. This control voltage is inverted and amplified by an inverting amplifier 650 to adjust the voltage applied to a controlling terminal (e.g., gate) of the transistor 620 in order to make $V_{SNS}$ equal to $V_{REF}$. In other words, the coil current ($I_C$) is stabilized by a negative feedback loop of the CCC circuit 600 when the coil current is at the current limit of the transistor.

Whether or not the coil current has reached the current limit can be determined by a voltage at the controlling terminal of the transistor 621. For example, the voltage at the gate of an IGBT may be used to determine with the coil current has reached the current limit of the IGBT. When the coil current has not reached the current limit then the gate voltage is clamped at the rail voltage of the gate driver supply (i.e., $V_S$). When the coil current has reached the current limit then the gate voltage is not equal to the rail voltage (e.g., the gate voltage is less than the rail voltage). For example, when the coil current is not at the current limit of the IGBT the gate voltage may be 5 volts, and when the coil current has reached the current limit of the IGBT the gate voltage may be less than 3.5 volts.

In a possible implementation, a threshold circuit 660 may receive a gate voltage ($V_G$) of an IGBT and process the gate voltage to determine if a fast ramp is necessary. For example, the threshold circuit 660 may compare the gate voltage ($V_G$) to a threshold and based on the comparison can configure a ramp generator 670 to output a voltage that varies in time according to fast ramp profile or a slow ramp. In a possible implementation, the ramp generator 670 is configured to output a fast ramp in response to a fast ramp enable signal and to output a slow ramp otherwise. For example, a fast ramp enable signal may be a first logical level (e.g., a logical high voltage) while the gate voltage of the IGBT is above a threshold (e.g., 4 volts), and while the fast ramp enable signal is at the first logical level, the ramp generator may output a fast ramp. Alternatively, the fast ramp enable signal may be a second logical level (e.g., a logical low voltage) while the gate voltage of the IGBT is below a threshold, and while the fast ramp enable signal is at the second logical level the ramp generator may output a slow ramp. In this way, the profile (i.e., slope) of the coil current during a SSD can depend on the gate voltage of the IGBT.

A fast ramp profile may be used only when necessary. For example, the fast ramp may be enabled only when the coil current is uncontrolled by the negative feedback loop at the start of an SSD period, such as when an SSD is activated while a coil is charging. When an SSD is activated after the coil has charged (e.g., due to an over dwell period that exceeds a time limit) the fast ramp may never be enabled during an SSD period. An advantage of the disclosed approach is that the circuits and methods can accommodate an SSD that includes a fast ramp, a slow ramp, or some combination of fast ramp and slow ramp. When an SSD period includes a fast ramp portion and a slow ramp portion, the fast ramp portion may occur before the slow ramp portion (e.g., at the beginning of the SSD period) and may be shorter than the slow ramp portion.

Figure 7:
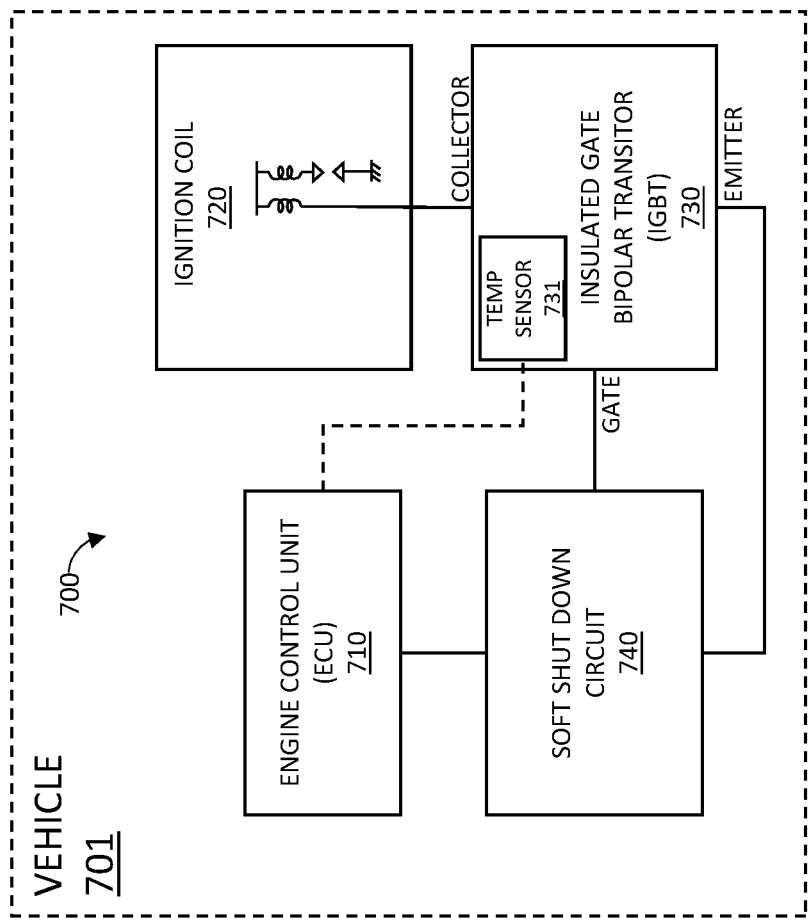
FIG. 7 is a block diagram of an ignition system according to an implementation of the present disclosure.

The disclosed approach may be used in an ignition system, such as in a vehicle. FIG. 7 is a block diagram of an ignition system according to an implementation of the present disclosure. The ignition system 700 includes an engine control unit (ECU) 710 that is configured to monitor the ignition system 700. The ignition system 700 may be part of a vehicle 701 (e.g., car, truck, motorcycle, etc.). Accordingly, the ECU 710 may also monitor conditions of an engine of the vehicle. In response to monitored conditions, the ECU 710 may issue signals to control activities of the ignition system 700. For example, the ECU 710 may generate a changing signal to trigger the ignition system 700 to charge an ignition coil 720. The ECU 710 may also generate a signal to trigger the ignition system 700 to discharge the ignition coil 720. For example, the ECU 710 may generate a soft shut down activation signal to trigger a soft shut down circuit (SSD circuit) 740 to control an IGBT 730 to discharge the ignition coil 720.

It is recognized that while the ECU controls charge timing and durations other modules or controls (e.g., an igniter module, ignition controller) may be used to issue a soft shut down signal and/or control a shut down in response to an over-dwell and/or over-temperature condition. Accordingly, the disclosure is not limited to the implementation of FIG. 7 as it is recognized that different and/or additional modules and/or circuits may be used to control/monitor the ignition system for a shut down.

The conditions monitored by the ECU may include a period during which the ignition coil is charged and remains charged (i.e., the coil current has reached the current limit) with no spark (i.e., a dwell period). The ECU may trigger the SSD circuit when the dwell period exceeds a threshold (i.e., an over dwell period (ODP)). The conditions monitored by the ECU may also include a temperature of the IGBT. A temperature sensor 731 may be physically coupled to (e.g., integrated with) the IGBT 730 and monitored by the ECU 710. Accordingly the ECU 710 may trigger the SSD circuit 740 when the temperature of the IGBT 730 exceeds a threshold (i.e., a thermal shut down (TSD)). The ODP condition and the TSD may correspond to different ignition coil conditions (i.e., states). For example, in the ODP condition, the ignition coil 720 is fully charged when the SSD circuit is triggered. In the TSD condition, the ignition coil may or may not be fully charged when the SSD circuit is triggered. The disclosed approach advantageously can accommodate all ignition coil states, including the state in which the ignition coil is not fully charged when the SSD circuit 740 is triggered (e.g., by a TSD condition).

The IGBT 730 and the SSD circuit 740 together form a CCC circuit, such as shown in FIG. 7. The IGBT 730 of the ignition system 700 is coupled to the ignition coil 720 and is configured (e.g. by an operating point of the IGBT) to have a current limit. A coil current of the ignition coil 720 may be at or below the current limit of the IGBT 730. When the coil current is at the current limit, then adjusting the current limit corresponds to adjusting the coil current. When the coil current is below the current limit, then adjusting the current limit may or may not correspond to adjusting the coil current.

The SSD circuit 740 of the ignition system 700 is coupled in a feedback loop with the IGBT 730 and can control the IGBT to reduce the current limit according to a fast ramp profile when the coil current is below the current limit and a slow ramp profile when the coil current is at the current limit. The SSD circuit 740 can make a determination of whether the coil current is at the current limit or below the current limit based on a gate voltage (i.e., a voltage at a gate terminal) of the IGBT 730. For example, the SSD circuit 740 may compare the gate voltage to a threshold and conclude that (i) the coil current is below the current limit when the gate voltage is above the threshold (e.g., 4.5 volts) and (ii) the coil current is at the current limit when the gate voltage is below the threshold.

Figure 8:
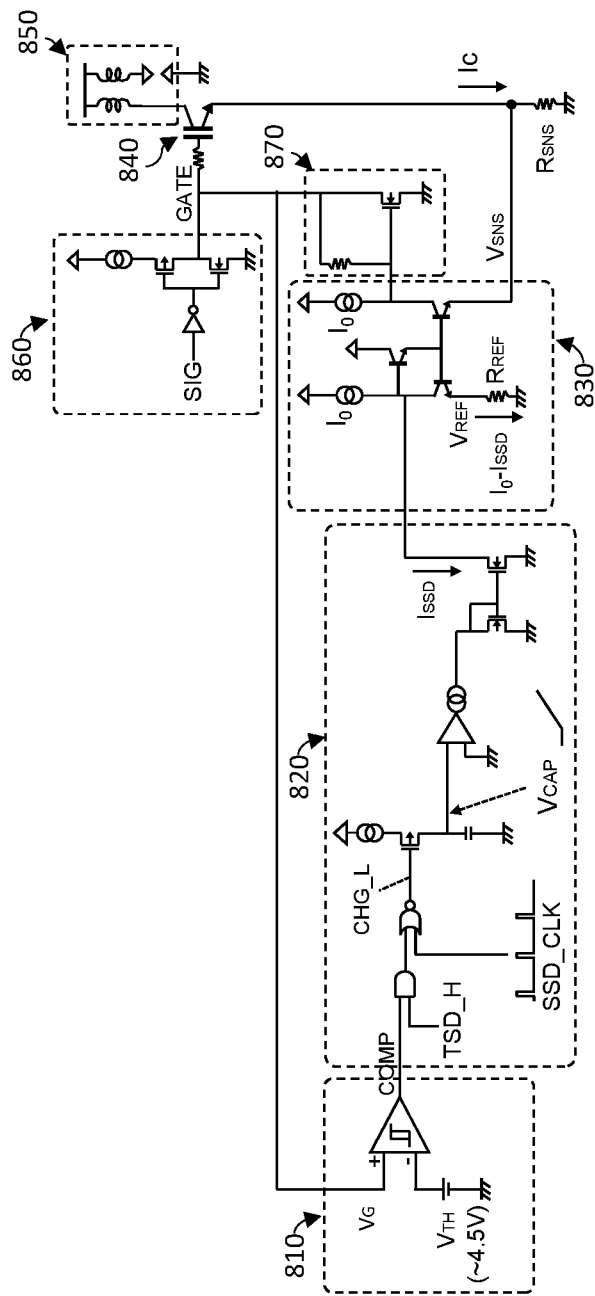
FIG. 8 is a detailed schematic of the coil current control circuit with ramp control according to an implementation of the present disclosure.

An implementation of the SSD circuit, an IGBT 840, and an ignition coil 850 is shown in FIG. 8. The IGBT 840 is coupled at its gate terminal (GATE) to a gate driver 860. The gate driver 860 includes a switch controlled by a signal (SIG) (e.g., from the ECU) to couple the gate to a current source or to ground depending on a logical level of the signal. The gate terminal of the IGBT is also coupled to an inverting amplifier 870. As described previously, (e.g., see FIGS. 1 and 6) the inverting amplifier 870 is part of a feedback loop that includes a current sensor ($R_{SNS}$) and a differential amplifier 830. The reference voltage ($V_{REF}$) for the differential amplifier 830 is created by a current ($I_O - I_{SSD}$) through a reference resistor ($R_{REF}$). The soft shut down (SSD) profile is results from a soft shut down current $I_{SSD}$ generated by a ramp generator 820. The rate of the ramp (i.e., fast or slow) may be determined by a capacitor voltage ($V_{CAP}$) that is charged according to a logic applied to a clock signal (SSD_CLK), a SSD activation signal (TSD_H), and to a comparison signal (COMP) from a threshold circuit 810 that corresponds to a comparison between the gate voltage $V_G$ and a threshold voltage ($V_{TH}$). When the gate voltage is above the threshold voltage ($V_G > V_{TH}$), a charging signal (CHG_L) enables continuous charging (i.e., at a 100% duty cycle) of the capacitor voltage ($V_{CAP}$) continuously, while when the gate voltage is below the threshold voltage ($V_G < V_{TH}$) the charging signal (CHG_L) enables pulsed charging (i.e., at a <100% duty cycle) of the capacitor voltage. The continuous charging charges the capacitor voltage ($V_{CAP}$) faster than pulsed charging charges the capacitor voltage ($V_{CAP}$). Accordingly, the gate voltage $V_G$ can enable the ramp generator to output a fast ramp or a slow ramp. The ramp generator can include a voltage to current converter to convert the capacitor voltage ($V_{CAP}$) to a soft shut down current ($I_{SSD}$) at the output of the ramp generator.

Figure 9:
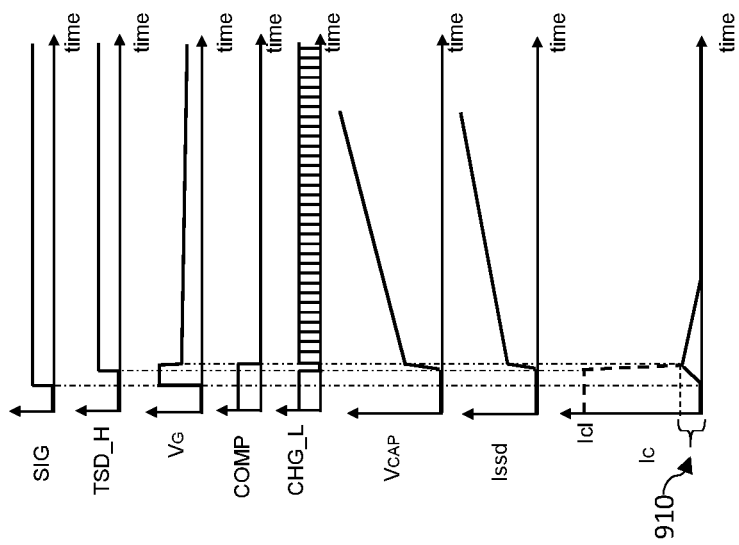
FIG. 9 are signal graphs of possible signals associated with the circuit of FIG. 8.

FIG. 9 illustrates possible signals associated with the circuit of FIG. 8. Each signal is plotted versus time and all signals are scaled an aligned with one another. As shown in the coil current (IC) graph, the current limit (ICL) is higher than the coil current at the beginning of a SSD period. Accordingly, a fast ramp is enabled at the start of the SSD period to quickly lower the current limit according to a fast ramp until a time at which the current limit equals the coil current. The time is indicated by the reduction of a gate voltage (VG), which indicates that is controlled by the feedback loop. For the remainder of the SSD period the current limit is lowered slower according to a slow ramp. As a result, a rise 910 in the coil current during the SSD period with a fast ramp portion is reduced compared a rise in the coil current during a SSD period without a fast ramp portion.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

The invention claimed is:

1. A coil current control circuit comprising:
   a transistor in series with a coil, the transistor controllable to conduct current at or below a coil current limit;
   a current sensing circuit configured to sense a coil current flowing through the transistor; and
   a current limit control circuit configured to compare a voltage from the current sensing circuit to a soft shut down (SSD) signal from a ramp generator circuit, and based on the comparison, control the coil current limit of the transistor to reduce the coil current over a SSD period according to a profile of the SSD signal, the profile of SSD signal being based on a gate voltage of the transistor.

2. The coil current control circuit according to claim 1, wherein the ramp generator circuit is coupled to a gate terminal of the transistor and is configured to compare the gate voltage to a threshold, and based on the comparison, make the profile of the SSD signal a fast ramp profile or a slow ramp profile.

3. The coil current control circuit according to claim 2, wherein when the gate voltage is above threshold when the coil current is below the coil current limit of the transistor and the gate voltage is below the threshold when the coil current is at the coil current limit.

4. The coil current control circuit according to claim 2, wherein when the coil current is below the coil current limit, the current limit control circuit is configured to reduce the coil current according to the fast ramp profile in order to minimize an unwanted current rise in the coil current during a soft shut down period.

5. The coil current control circuit according to claim 1, wherein the coil is part of an ignition coil.

6. The coil current control circuit according to claim 1, wherein the transistor is an insulated gate bipolar transistor (IGBT).

7. The coil current control circuit according to claim 1, further including a gate driver coupled to the current limit control circuit and to a gate terminal of the transistor.

8. The coil current control circuit according to claim 1, wherein coil current control circuit is triggered by a thermal shut down (TSD) signal.

\* \* \* \* \*